United States Patent

Nayebi et al.

Patent Number: 6,064,274
Date of Patent: May 16, 2000

[54] RCB CANCELLATION IN HIGH-SIDE LOW POWER SUPPLY CURRENT SOURCES

[75] Inventors: Mehrdad Nayebi, Palo Alto; Stephen D. Edwards, San Jose; Phil Shapiro, Palo Alto, all of Calif.

[73] Assignees: Sony Corporation of Japan, Tokyo, Japan; Sony Electronics, Inc., Park Ridge, N.J.

[21] Appl. No.: 09/219,196

[22] Filed: Dec. 21, 1998

Related U.S. Application Data

[63] Continuation-in-part of application No. 09/183,452, Oct. 30, 1998, which is a continuation-in-part of application No. 09/183,198, Oct. 30, 1998, which is a continuation-in-part of application No. 09/183,321, Oct. 30, 1998.

[51] Int. Cl.[7] .............................. H03L 7/08; H03L 7/085; H03L 7/089; G05F 1/10; G05F 1/46

[52] U.S. Cl. ................................ 331/17; 331/8; 327/157; 327/538

[58] Field of Search ..................... 331/8, 15, 17, 331/18, 25; 327/156–159, 538–543

[56] References Cited

U.S. PATENT DOCUMENTS 5,856,755  1/1999  Falconer et al. .................. 327/540

Primary Examiner—David Mis
Attorney, Agent, or Firm—Wagner, Murabito & Haug, LLP

[57] ABSTRACT

A current source circuit for providing a stable current into a filter element of a phase-lock-loop circuit of a clock generator. The current source circuit comprises a first resistor coupled to a voltage supply. The emitter of a first transistor is coupled to the first resistor; the collector is coupled to a capacitor which is part of the filter elements of the phase-lock-loop. Current flows from the voltage supply through the first resistor and first transistor into the capacitor. Leakage current flowing out of the capacitor due to the inherent Rcb impedance associated with the first transistor is directed to a path provided by a second transistor. The second transistor has an emitter coupled to the base of the first transistor and a collector coupled to the capacitor. The second transistor is biased such that the Rcb leakage current is directed back into the capacitor. Thereby, the Rcb leakage current flowing out from the capacitor is canceled by the current flowing back into the capacitor via the second transistor. This produces a more stable current, and hence, more stable voltage being maintained by the capacitor. A more stable voltage means that the capacitor can be made smaller. In turn, this enables the phase-lock-loop to be fabricated on-chip with the rest of the clock generator, thereby minimizing its susceptibility to external noise and interferences. Furthermore, a more stable voltage across the filter element of the phase-lock-loop reduces unwanted jitter in the clock signal.

18 Claims, 5 Drawing Sheets

RCB CANCELLATION IN HIGH-SIDE LOW POWER SUPPLY CURRENT SOURCES

This application is a continuation-in-part of and claims the benefit of copending application Ser. No. 09/183,452 filed on Oct. 30, 1998, application Ser. No. 09/183,198 filed on Oct. 30, 1998, application Ser. No. 09/183,321 field on Oct. 30, 1998.

FIELD OF THE INVENTION

The present invention relates to a circuit for minimizing the current leakage associated with a phase-lock-loop filter necessary for high speed clock generators used in advanced digital systems. More particularly, the present invention provides a novel circuit for reducing the effect associated with the Rcb leakage path inherent in the high side current source transistor of the PLL filter.

BACKGROUND OF THE INVENTION

High speed digital systems, such as engineering workstations and personal computers, require clock sources to provide a timing reference. It is imperative that these timing references be highly accurate and stable. Otherwise, the performance of the digital systems relying on these clock sources would be impaired. One method for achieving a clean, fast, and accurate clock source is to use a crystal oscillator coupled with a phase-lock-loop (PLL) circuit to regulate its frequency. In this type of arrangement, the goal then is to design the PLL such that it exhibits low jitter and high bandwidth in order to generate an optimal clock signal.

The PLL circuitry in the clock generator typically contains a voltage controlled oscillator (VCO) that receives a voltage level maintained by filter components. Normally, charging currents and voltage controlled oscillator gains are so high that externally situated filter components are required to achieve the low jitter and bandwidth requirements necessary for clock generator circuits. However, external, "off-chip," filter components (e.g., capacitors, etc.) increase the overall cost of the digital system in part by making manufacturing more complex, and also increase the physical size of the digital system. Furthermore, off-chip filter components also decrease system reliability by increasing the phase jitter because they are susceptible to external noise being injected into the clock circuit. Clock jitter is reduced if the traditional external elements of the PLL loop filter can somehow be fabricated onto the chip itself. However, in order to integrate filter components "on-chip," it is mandatory to use smaller sized filter components. Using the standard sized filter components is impractical because it would consume too much of the silicon area of the chip. In other words, the chip is not big enough to fit all the traditional filter components within it. Thus, one must resort to using smaller sized filter component to achieve the same PLL characteristics. But this leads to tighter filter requirements because smaller sized filter components are extremely sensitive to fluctuations in voltage and current levels. Even the smallest amount of voltage and/or current fluctuation can significantly worsen the PLL's jitter and bandwidth characteristics. One factor contributing to worsening the jitter is the Rcb leakage current inherent with any transistor.

Accordingly, what is needed is some method for minimizing the jitter and maintaining the bandwidth of an on-chip PLL. The present invention provides a unique, novel solution by implementing a circuit which detects the amount of leakage current associated with the Rcb path of a high side current source transistor of the PLL and automatically injects an equal but opposite amount of current back to the filter components, such that the net effect is as if there was no leakage at all. Thus, the present invention enables the PLL to be integrated on the same chip, which reduces cost and minimizes its susceptibility to external noise and other interferences, while also minimizing the effects of current leakage thereby reducing clock jitter and maintaining tight PLL bandwidth requirements.

SUMMARY OF THE INVENTION

The present invention pertains to a highly stable current source circuit. Basically, the present invention provides a mechanism whereby the leakage current inherent to a transistor used in the current source is first detected and then an equal but opposite amount of current is fed back in order to effectively cancel out the leakage current. The net effect is as if there were no leakage current at all, thereby providing a highly stable current source. This current source circuit is ideal for providing a stable current into a filter element of a phase-lock-loop circuit of a clock generator. For example, a more stable current provided into the capacitor of the phase-lock-loop will ultimately result in reducing unwanted clock jitter. Furthermore, a more stable current means that the capacitor can be made smaller because its voltage can be maintained at a constant level. In turn, this enables the phase-lock-loop to be fabricated on-chip with the rest of the clock generator, thereby minimizing its susceptibility to external noise and interferences.

In the currently preferred embodiment of the present invention, the current source circuit comprises a resistor coupled to a voltage supply. The emitter of a transistor is coupled to the resistor; the collector is coupled to a capacitor which is part of the filter elements of the phase-lock-loop. Current flows from the voltage supply through the resistor and transistor into the capacitor. Leakage current flowing out of the capacitor due to the inherent Rcb impedance associated with the transistor is directed to a path provided by a second transistor. The second transistor has an emitter coupled to the base of the first transistor and a collector coupled to the capacitor. The second transistor is biased such that the Rcb leakage current is directed back into the capacitor. Thereby, the Rcb leakage current flowing out from the capacitor through the first transistor is canceled by the current flowing back into the capacitor via the second transistor.

BRIEF DESCRIPTION OF THE DRAWINGS

The accompanying drawings, which are incorporated in and form part of this specification, illustrate embodiments of the invention and, together with the description, serve to explain the principles of the invention.

DETAILED DESCRIPTION OF THE INVENTION

In the following detailed description of the present invention, a novel circuit for Rcb cancellation in high-side, low power supply current sources, numerous specific details are set forth in order to provide a thorough understanding of the present invention. However, it will be recognized by one skilled in the art that the present invention may be practiced without these specific details or with equivalents thereof. In other instances, well known methods, procedures, components, and circuits have not been described in detail as not to unnecessarily obscure aspects of the present invention.

Figure 1:
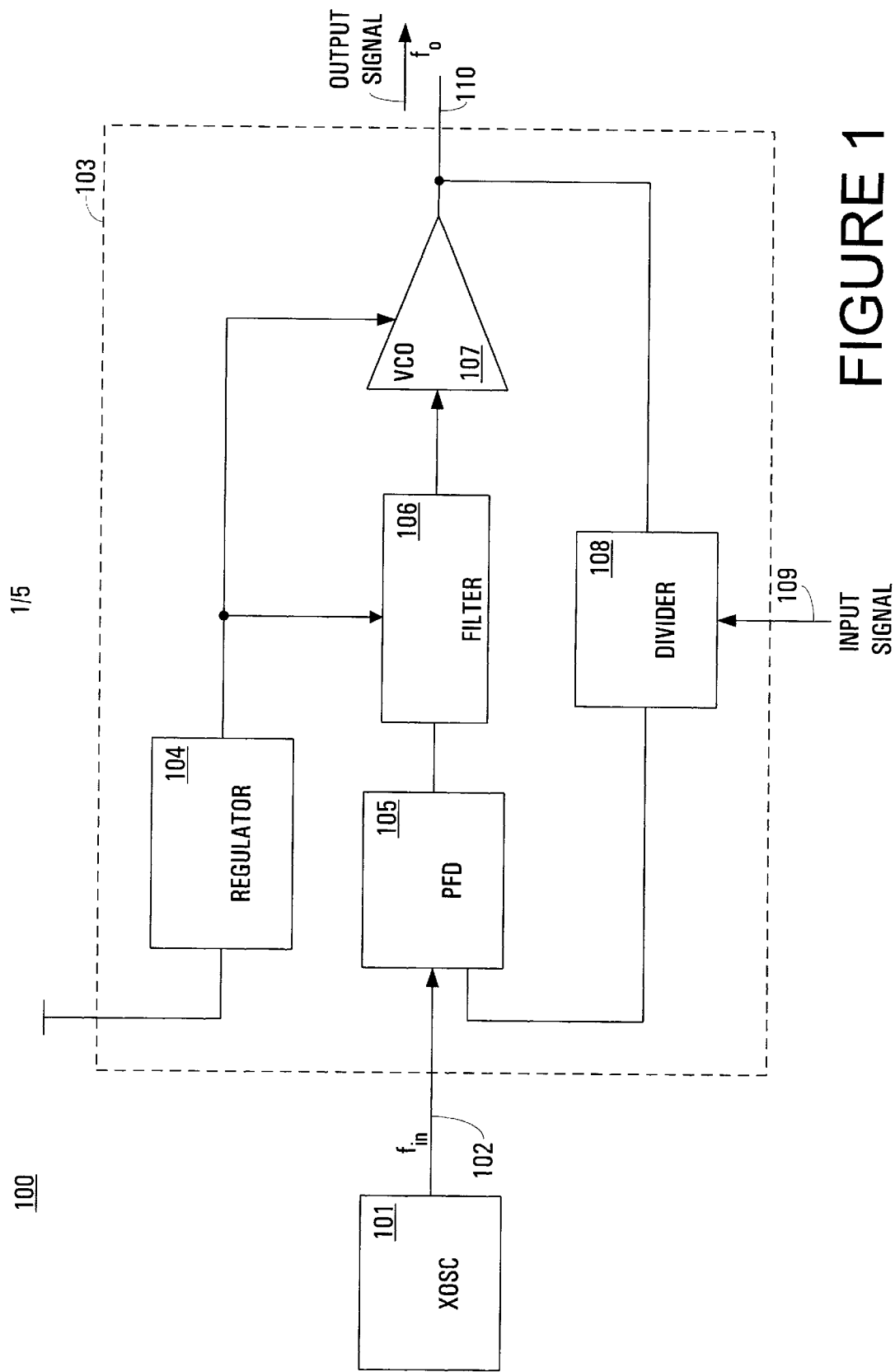
FIG. 1 is a logical block diagram of a clock generator circuit 100 upon which the present invention can be practiced.

FIG. 1 is a logical block diagram of a clock generator circuit 100 upon which the present invention can be practiced. Clock generator circuit 100 includes a crystal oscillator 101 that generates an input frequency (fin) at 102. The fn signal is input to a phase lock loop circuit 103. PLL circuit 103 is comprised of voltage regulator 104, phase frequency detector (PFD) 105, filter 106, voltage controlled oscillator (VCO) 107, and divider 108. The PFD 105 is coupled to receive frequency 102 and is coupled to a divider circuit 108 which receives an external divider control signal 109. The PFD 105 is also coupled to a filter circuit 106 which, in turn, is coupled to VCO 107. A feedback loop from the output of VCO 107 to the divider circuit 108 back to the PFD 105 is established to control the output frequency (fo) 110. The filter 106 and the VCO circuit 107 are coupled to receive power from a regulator 104 which is coupled to a power supply. The output of the VCO circuit 107 generates the output clock frequency (fo) at 110.

Figure 2:
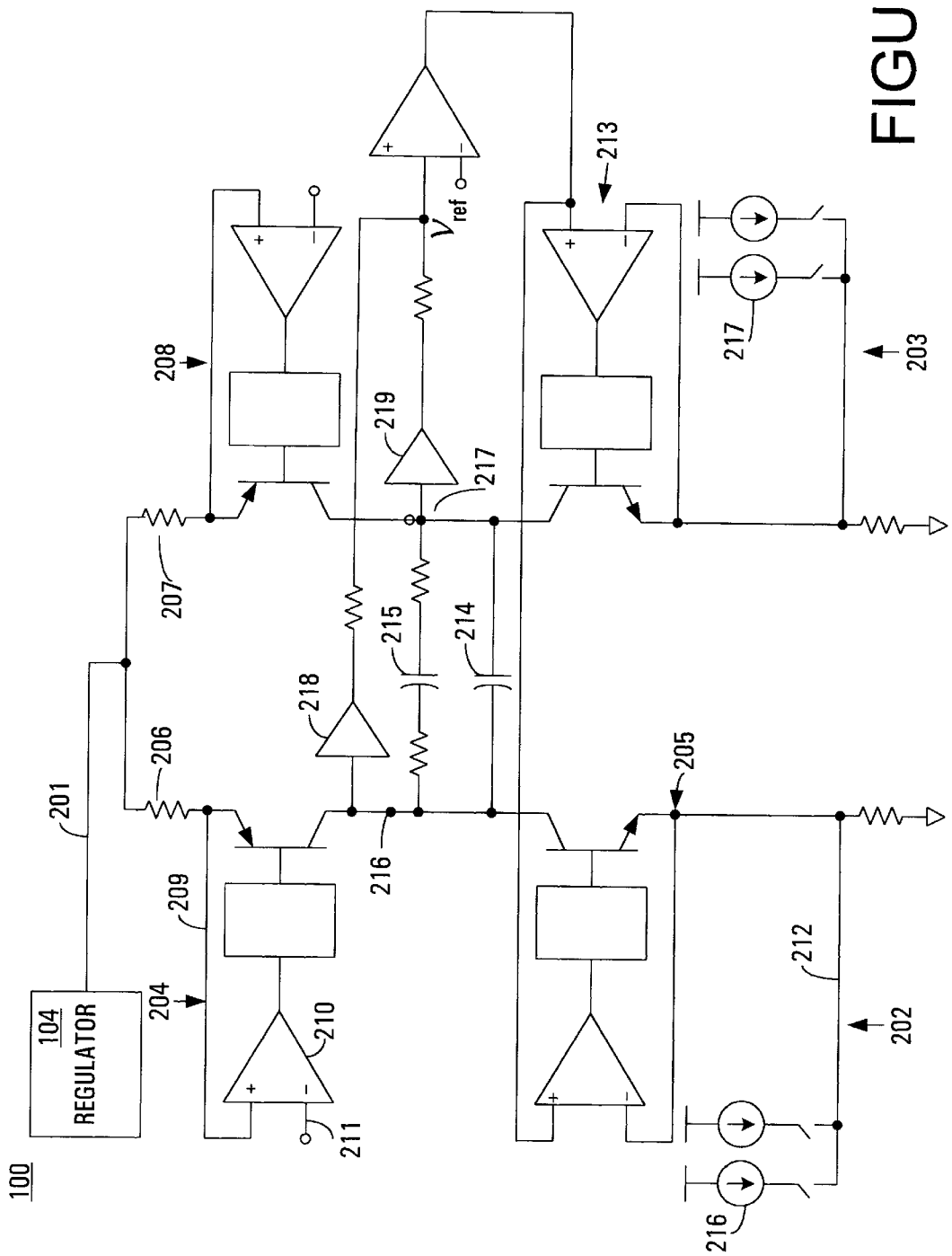
FIG. 2 illustrates in more detail a clock generation circuit as one example in which the current source circuit of the present invention can operate.

FIG. 2 illustrates in more detail a clock generation circuit 100 as one example in which the current source circuit of the present invention can operate. The high-side current source design of the present invention can operate in conjunction with a variety of different circuit systems where Rcb cancellation is required, (e.g., a high impedance load in an operational amplifier). Therefore, it is appreciated that the clock generation circuit 100 is only one example of such a circuit system.

Specifically, clock generation circuit 100 of FIG. 2 contains a phase lock loop circuit having a differential circuit configuration. Circuit 100 is implemented "on chip," that is, a single integrated circuit chip is used to realize circuit 100. The high side of a power supply voltage is coupled to regulator 104. Although the high side voltage can be of a wide range of voltages, in one embodiment the high side voltage is approximately within the range of 2.7 to 3.3 volts. The regulator 104 is coupled via line 201 to two ends of a differential circuit configuration having differential side 202 and differential side 203. Each differential side include a current source circuit (e.g., 204) and a current sink circuit (e.g., 205). Voltage supply line 201 is coupled to resistors 206 and 207. Resistor 206 is coupled to the other components of current source 204 of the present invention. Current source 208, also of the design of the present invention includes resistor 207. As described in more detail below, current source 204 contains a feedback loop 209 and an operational amplifier circuit 210 which receives a direct current (DC) bias voltage at its (−) input 211 and a feedback loop 209 at its (+) input. A charge pump injects current over line 212.

Current sink circuits 205 and 213 are described in co-pending U.S. patent application Ser. No. 09/183,452, concurrently filed herewith, entitled "Low Side Current Sink Circuit Having Improved Output Impedance to Reduce Effects of Leakage Current," by Nayebi et al., attorney docket number SONY-50M2407 and assigned to the assignee of the present invention.

The current sources 204 and 208 are used, in one embodiment, in combination with current sink circuits 205 and 213, to maintain current through filter elements 214 and 215. Charge pumps 216 and 217 inject additional current to thereby establish a differential voltage across the filter elements 214 and 215. Filter components 214 and 215 are integrated circuit capacitors and as such they are integrated within the IC chip of circuit 100. The differential voltage is used as an input to a voltage controlled oscillator circuit of the phase lock loop circuit within clock generation circuit 100. It is desired to provide a stable voltage at the input of the voltage controlled oscillator circuit in order to reduce clock jitter within clock generation circuit 100. One way that the voltage can change across the filter elements 214 and 215 is as a result of current fluctuations in the current injected from current sources 204 and 208.

Specifically, current flowing across the filter elements 214 and 215 charges them, thereby changing their differential voltage. In circuit 100, the filter elements, e.g., capacitors 214 and 215, are designed to be small internal "on-chip" devices (having correspondingly small capacitance values). As a result, the voltage level across these small filter elements 214 and 215 is very sensitive to small changes in the injected currents at nodes 216 and 217. The changing differential voltage across filter elements 214 and 215 causes time jitter in circuit 100 because it causes changes in the input voltage of the voltage controlled oscillator.

Buffer circuits 218 and 219 sample the voltage over the filter elements. Buffer circuits contain a high input impedance buffer circuit as described in patent application Ser. No. 09/183,198, concurrently filed herewith, entitled "High Input Impedance Buffer Circuit," by Nayebi et al., attorney docket number SONY-50M2411 and assigned to the assignee of the present invention.

Therefore, in accordance with the design of the present invention, the current supplied from current sources 204 and 208 is very stable once it is set to a desired level and held there over time. In accordance with the present invention, by reducing leakage current, the filter elements 214 and 215 maintain a stable differential voltage level. In operation, the current supplied from current sources 204 and 208 is adjusted to set a particular operational frequency of clock generation circuit 100 and then held over a hold period. Hold periods are situated in between phase lock loop correction pulses. The present invention advantageously offsets the effects of leakage current as one way to stabilize the current supplied from current sources 204 and 208 during the hold periods. The effects of leakage current are reduced, in accordance with the present invention, by establishing a current path through which the Rcb leakage current is routed back to nodes 216 and 217. By establishing a separate current path for the Rcb leakage current, this leakage current is effectively fed back into the filter component 214, thereby providing a stable input voltage to the voltage controlled oscillator of the phase lock loop circuit and reducing jitter in the output clock signal of circuit 100.

Figure 3:
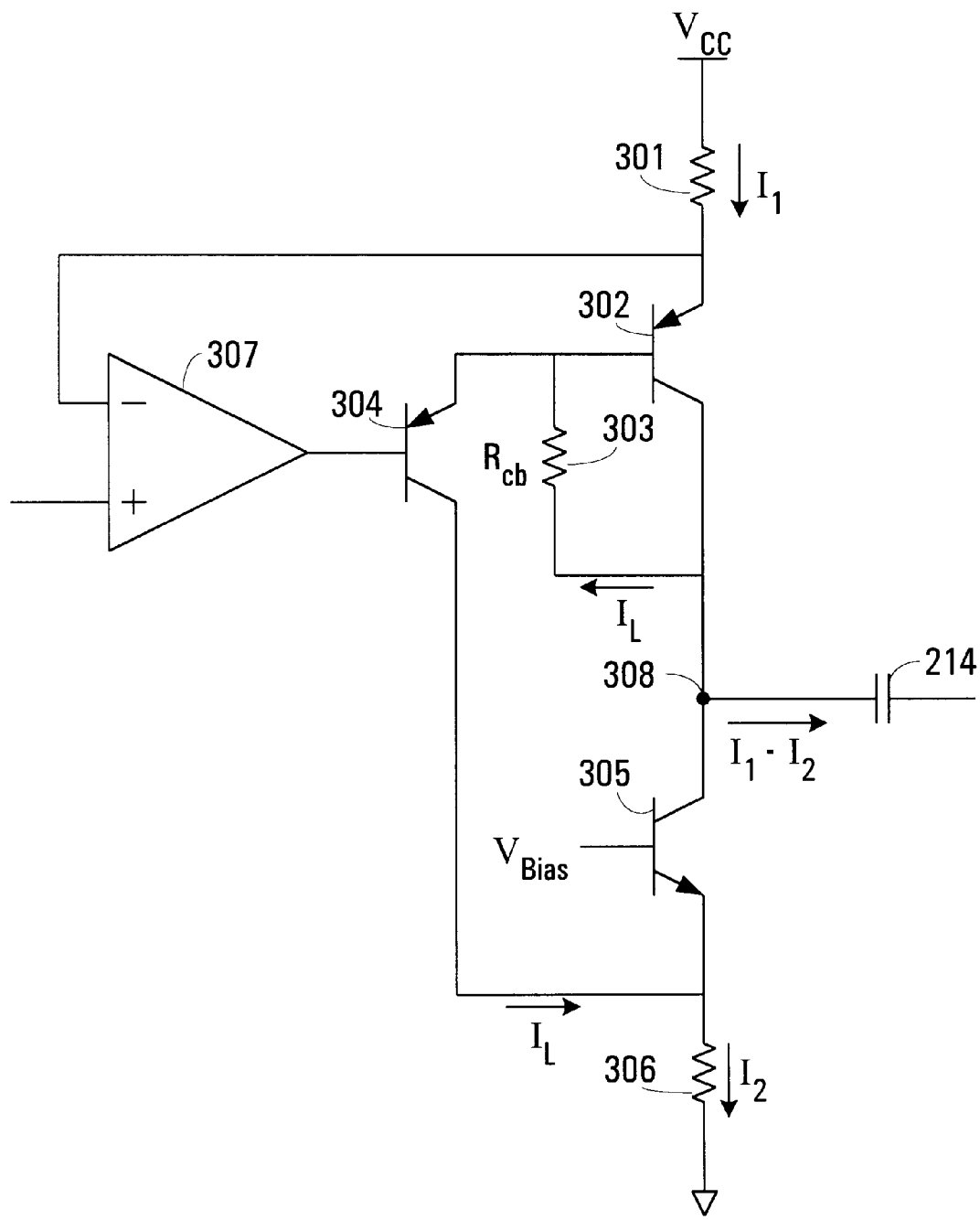
FIG. 3 illustrates a circuit design according to the present invention that can be used to implement high side current sources.

FIG. 3 illustrates a circuit design 300 according to the present invention that can be used to implement the high side current sources 204 and 208 of FIG. 2. It should be noted that a bipolar process is used in the currently preferred embodiment of the present invention. A resistor 301 is coupled to a supply voltage, Vcc. The voltage across resistor 301 produces a current I1. The emitter of a PNP transistor 302 is coupled to resistor 301. The collector of PNP transistor is coupled to a capacitor 214. Capacitor 214 is part of the filter component of the PLL as described above. The base of PNP transistor 302 is coupled to the output of operational amplifier (op-amp) 307. The negative input to op-amp 307 is coupled to the collector of transistor 302, while a voltage is supplied to the positive input to op-amp 307 in order to bias the base of transistor 302 such that transistor 302 is turned on. Thereby, transistor 302 conducts the I1 current through to node 308. This part of the circuit comprises the high side current source, I1. The low side current sink for producing I2 is comprised of NPN transistor 305 and resistor 306. The base of NPN transistor 305 is coupled to a bias voltage. There is a Vbe voltage drop across the base-emitter of transistor 305. The resulting voltage of Vbias-Vbe across resistor 306 causes a fixed current I2 to flow to ground. In effect, the I1 current is flowing into node 308 from the high side current source while the I2 current from the low side current source is caused to flow out from node 308. Thus, there is a current of I1–I2 flowing through to capacitor 214, which is part of the filter components of the PLL as described above. Capacitor 214 is fabricated on the same chip as the rest of the circuit shown in FIGS. 2 and 3. Consequently, capacitor 214 is relatively small in order to conserve silicon area on the chip. In the currently preferred embodiment, capacitor 214 is on the order of 100 picofarads. Resistors 301 and 306 are 30 KΩ.

Ideally, transistor 302 would have an infinite impedance looking from its collector to base. However, in practice, all transistors have a finite Rcb impedance, anywhere from approximately 500 kΩ to 2 MΩ. As such, there will be some amount of leakage current (IL) flowing from node 308 through Rcb. Note that Rcb 303 is not a separate resistor; it represents the impedance inherent between the collector-base of transistor 302. As discussed above, this leakage current can cause the voltage across capacitor 214 to fluctuate, which leads to unwanted jitter. The present invention does not stop or reduce this leakage current, IL, from flowing through Rcb 303. Instead, the present invention routes IL such that it essentially cancels itself out. This is accomplished by adding PNP transistor 304 to the high side current source. The base of transistor 304 is coupled to the output of op-amp 307. The emitter of transistor 304 is coupled to the base of transistor 302. And the collector of transistor 304 is coupled to the emitter of transistor 305. In operation, the base of transistor is biased by op-amp 307 such that it is conducting. It conducts the leakage current IL flowing from Rcb 303 back through transistor 305 to node 308, thereby effectively canceling itself out. In other words, the present invention compensates by detecting how much current is leaking and then injecting the equal but opposite amount of current back so that the net effect is as if there were no leakage. Applying Kirchoff's current law (the algebraic sum of all currents entering a node must equal the algebraic sum of all the currents leaving a node) to node 308, one can determine that there is a current I1 flowing from the high side current source and entering node 308; a current IL flowing from transistor 304 and entering node 308; a current I2 flowing from the low side current source and leaving node 308; and a current IL flowing through Rcb and leaving node 308. Therefore, adding all these currents entering and leaving node 308 yields the fact that there must be I1–I2 current flowing out of node 308 and into capacitor 214. Note that the leakage current IL flowing out of node 308 due to Rcb of transistor 302 is effectively canceled out by approximately the same amount of IL current being fed back into node 308 via transistor 304. As such, the present invention is ideally suited for canceling out Rcb (e.g., it could be used as a high impedance load in an op-amp).

Figure 4:
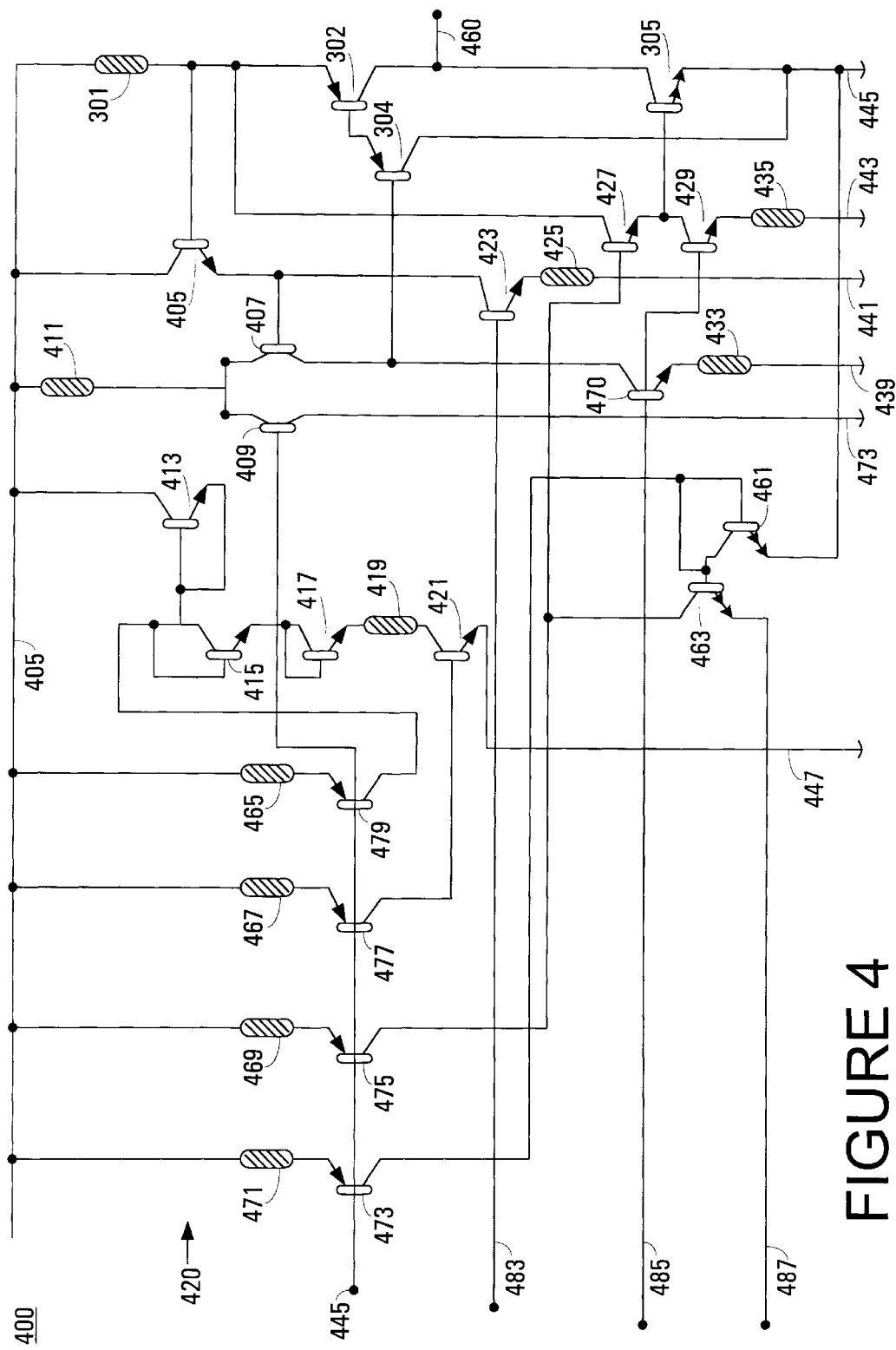
FIG. 4 illustrates the circuitry of one embodiment of a differential side of the clock generation circuit.

FIG. 4 illustrates the circuitry 400 of one embodiment of a differential side of the clock generation circuit. The circuitry 400 includes a particular embodiment of current source circuit 300 in accordance with the present invention and also includes a current sink. It should be noted that the current source and sink circuitry for either differential side are the same. Specifically, the emitter degeneration resistor, RE, 301 is coupled to Vcc 405. Resistor 301 is coupled to the emitter of transistor 302. The positive (+) input of the operational amplifier circuit (shown as 307 of FIG. 3) is represented by line 445 which is coupled to the base of transistor 409. The negative (−) input of operational amplifier circuit 307 is represented by the base of transistor 405 which is coupled to the emitter of transistor 302 in a feedback loop. The output of operational amplifier 307 is taken at the emitter of transistor 304 which is coupled to the base of transistor 302.

The collector of transistor 302 is coupled to output node 460 which is coupled to transistor 305. Transistor 305 is coupled to line 445 and also coupled to transistor 304 and to transistor 461. The emitter of transistor 302 is coupled to transistor 427 which is coupled to the base of transistor 331 which is also coupled to transistor 429. Transistor 429 is coupled to resistor 435 which is coupled to line 443. The supply voltage 405 is also coupled to transistor 405 which is coupled to the base of transistor 407 and also coupled to transistor 423. Transistor 423 is coupled to resistor 425 which is coupled to line 441. The supply voltage 405 is coupled to resistor 411 which is coupled to both transistors 409 and 407. Transistor 407 is coupled to the base of transistor 304 and also coupled to transistor 470 which is coupled to resistor 433 which is coupled to line 439.

The base of transistor 470 is coupled to line 485 which is also coupled to the base of transistor 429. Transistor 409 is coupled to line 437. The base of transistor 461 is coupled to the emitter of transistor 461 and also coupled to the base of transistor 463 and also coupled to transistor 473. Line 487 is coupled to transistor 463. Transistor 463 is coupled to the base of transistor 427 and also coupled to transistor 475. Line 483 is coupled to the base of transistor 423. Line 447 is coupled to transistor 421. In addition to the base of transistor 409, line 245 is coupled to the bases of transistors 473, 475, 477 and 479.

The supply voltage 405 is also coupled to transistor 413. The collector of transistor 413 is coupled to the base of collector 413 and also to the collector of transistor 415 and to the base of transistor 415 and to transistor 479. Transistor 415 is coupled to the collector and base of transistor 417. Transistor 417 is coupled to resistor 419 which is coupled to transistor 421. The supply voltage 205 is also coupled to resistors 471, 469, 467 and 465. Resistor 471 is coupled to transistor 473. Resistor 469 is coupled to transistor 475. Resistor 467 is coupled to transistor 477. Resistor 465 is coupled to transistor 479.

It is appreciated that resistor 411 of FIG. 4 is used between the supply voltage 405 and the emitters of transistors 407 and 409 in lieu of a transistor in an effort to increase the operational (e.g., DC) voltage at the emitters of PNP transistors 409 and 407. In low voltage applications (e.g., where the supply voltage 405 is between 2.0 and 3.3 volts), this arrangement acts to increase the dynamic range of the current source in accordance with the present invention so that the current source can more effectively operate within low voltage environments. The voltage at the emitters of transistor 407 and 409 is a function of the tail current and the bias current.

In addition to the resistor 411, the operational amplifier circuit 220 of the present invention also contains a level shifting circuit to increase the operational voltage at the emitter of transistor 430 to help increase the dynamic range of current source in low voltage environments. The level shifting circuitry includes PNP transistor 407 and NPN transistor 405. There is a 7/10 volt drop from the voltage supply 405 to the base of transistor 407. From the base of transistor 407 there is a 7/10 volt increase to the base of transistor 405 which is also the emitter of transistor 430. This circuit configuration creates a DC level shift to increase the DC voltage at the emitter of transistor 430. This effectively increases the dynamic linear range of operation for the current source in cases when a low voltage power supply is used. It is desired to have the output of the current source swing as large as possible to achieve a low VCO gain for the VCO of FIG. 1.

Figure 5:
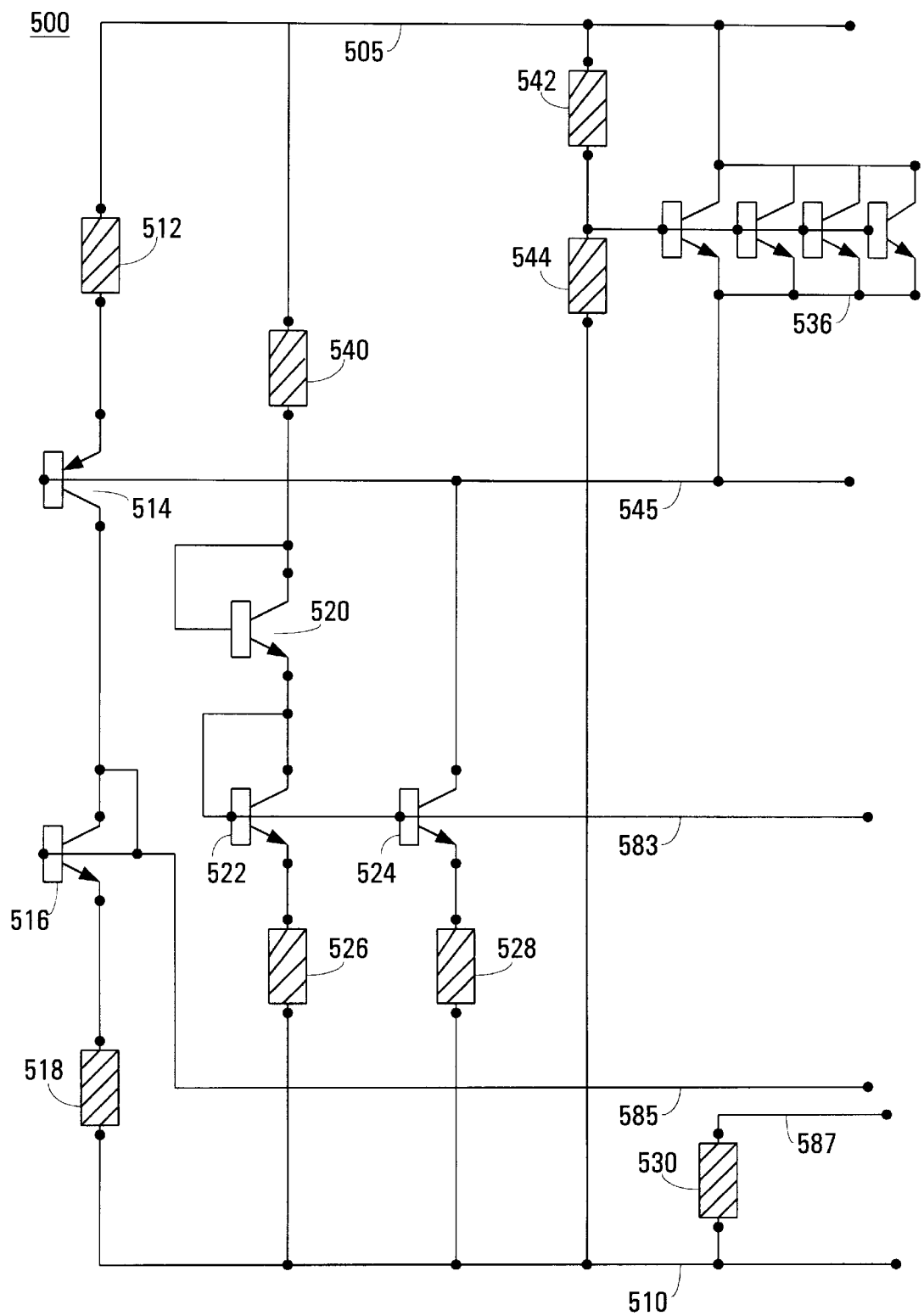
FIG. 5 illustrates an exemplary circuit for generating the Vbias voltage for biasing transistors used in the high side current source.

FIG. 5 illustrates an exemplary circuit for generating the Vbias voltage over line 545. Using a resistor divider technique, Vcc 505 is coupled to resistor 542 which is coupled in series to resistor 544 which is coupled to ground. The node between resistors 542 and 544 is coupled in parallel to the bases of NPN transistors of a buffer circuit 536. The NPN transistors of buffer circuit 436 are also coupled to Vcc 505 and also to line 545. Line 245 is coupled to the base of transistor 514. Buffer circuit 536 makes the Vbias voltage on line 545 less dependent on loading.

Line 545 is also coupled to transistor 524 which is coupled to resistor 528 which is coupled to ground. Vcc 505 is coupled to resistor 540 which is coupled to transistor 520 which is coupled to transistor 522 which is coupled to resistor 526 which is coupled to ground. The node between transistors 522 and 520 is coupled to the base of transistors 522 and 524 and supplied as line 583. The node between resistor 540 and transistor 520 is coupled to the base of transistor 520. Node 510 is coupled to resistor 530 and supplied as line 587.

Vcc 505 of FIG. 5 is coupled to resistor 512 which is coupled to transistor 514 which is coupled to transistor 516 which is coupled to resistor 518 which is coupled to ground. The node between transistor 514 and 516 is coupled to the base of transistor 516 and supplied as line 585.

Although a number of different resistor configurations can be used in accordance with the present invention, Table I below illustrates one exemplary resister assignment.

TABLE I

| Resistor | Approximate Resistor Valve (ohms) |
|---|---|
| 471 | 75k |
| 469 | 60k |
| 467 | 75k |
| 465 | 60k |
| 419 | 30k |
| 411 | 30k |
| 433 | 45k |
| 425 | 30k |
| 435 | 65k |
| 301 | 30k |
| 542 | 3k |
| 544 | 24k |
| 540 | 25k |
| 512 | 60k |
| 518 | 45k |
| 526 | 7k |
| 528 | 27k |
| 530 | 3k |

The operation of the circuit implementation is described as follows. The emitter degeneration resistor is resistor 301 as shown in FIG. 3. The inverting side of the operational amplifier 307 is formed by transistors 405 and transistor 407. Tail current is provided by resistor 411. A current sink which is half the tail current is provided by transistor 470. The output of the operational amplifier 307 is at the emitter of transistor 304. The non-inverting side of the operational amplifier 307 consists of transistor 405.

With respect to FIG. 5, the Vbias voltage input is formed by the divider consisting of resistors 542 and 544. Resistor 512, transistor 514, transistor 516 and resistor 518 of FIG. 5 provide the bias line 585 for the current source transistor 570. The operational amplifier topology of the present invention is designed to operate within low power supply environments where the power supply voltage, Vcc 205, is low (e.g., 2.0 to 3.3 volts). In one embodiment, the power supply voltage Vcc 205 is 2.7 volts. Low power supply voltage restricts the size of the voltage that can be impressed across resistor 310. This requires that an NPN input stage (transistor 405) be used in the operational amplifier circuit 307. This NPN transistor 405 also provides level shifting so that a PNP input operational amplifier can be used to simplify the resulting circuit. This NPN transistor 405 is therefore followed by a PNP transistor 407. In one embodiment, a resistor 411 is used to supply tail current in lieu of a transistor due to constraints. This current is constant.

The preferred embodiments of the present invention, a novel circuit for Rcb cancellation in a high side, low power supply current source, are thus described. While the present invention has been described in particular embodiments, it should be appreciated that the present invention should not be construed as limited by such embodiments, but rather construed according to the below s.

What is claimed is:

1. A current source circuit comprising:
   a voltage supply;
   a first resistor coupled to the supply voltage;
   a first transistor device having an emitter coupled to the resistor, a base, and a collector coupled to a node, wherein current flows from the voltage supply through the first resistor and the first transistor device into the node;
   a capacitor coupled to the node, wherein the capacitor comprises part of a filter for a phase-lock-loop circuit;
   a second transistor device having an emitter coupled to the base of the first transistor device, a base, and a collector coupled to the node, wherein current flowing from the node through a collector-base of the first transistor device is fed back through the second transistor device to the node.

2. The current source of claim 1, wherein the current flowing from the node is Rcb leakage current associated with the first transistor device.

3. The current source of claim 1 further comprising an operational amplifier circuit having a first input for accepting a bias voltage, a second input coupled to the emitter of the first transistor device and an output coupled to the base of the second transistor device, wherein said operational amplifier circuit maintains a constant current flowing through the first transistor device.

4. A current source circuit of claim 1, wherein the first transistor device is a PNP transistor device.

5. A current source circuit of claim 1, wherein the resistor is an emitter degeneration resistor of approximately 30 K ohms.

6. A current source circuit of claim 1, wherein the first input of said operational amplifier circuit is a positive input and wherein the second input is a negative input.

7. A current source circuit of claim 1, wherein said supply voltage is between 2.7 and 3.3 volts.

8. The current source circuit of claim 1 further comprising:
   a second resistor coupled to ground;
   a third transistor device having a collector coupled to the node, a base accepting a bias voltage, and an emitter coupled to the second resistor, wherein current flows out from the node, through the third transistor device and through the second transistor device to ground.

9. The current source circuit of claim 8, wherein the emitter of the third transistor device is coupled to the collector of the second transistor device, wherein the current flowing through the collector-base of the first transistor device flows through the second transistor device and the third transistor device back to the node.

10. A current source comprising:
    a supply voltage;
    a first resistor coupled to the supply voltage;
    a first transistor coupled to the first resistor for conducting current to a node, wherein there is an inherent leakage current corresponding to an Rcb impedance associated with the first transistor;
    a second transistor coupled to the first transistor which conducts the leakage current back towards the node, wherein leakage current flowing out from the node is approximately canceled by leakage current flowing into the node.

11. The current source of claim 10 further comprising:
    a third transistor coupled to the second transistor;
    a second resistor coupled between the third transistor and ground, wherein the third transistor sinks current from the node through the second resistor to ground.

12. The current source of claim 11, wherein the leakage current flows out from the second transistor, through the third transistor and into the node.

13. The current source of claim 12, wherein the first transistor is a bipolar PNP transistor, the second transistor is a bipolar PNP transistor; and the third transistor is a bipolar NPN transistor.

14. The current source of claim 13 further comprising an operational amplifier having an output coupled to the second transistor and at least one input coupled to the first transistor.

15. The current source of claim 14 further comprising a capacitor coupled to the node, wherein the capacitor comprises part of a filter of a phase-lock-loop circuit of a clock generator.

16. A computer system having a clock controlled by a phase lock loop circuit, a current source circuit having a stable output current for maintaining a voltage at an input of a capacitor which forms part of a filter comprising the phase lock loop, said current source circuit comprising:
    a first resistor coupled to a supply voltage;
    a first transistor device having an emitter coupled to the first resistor, a base, and a collector coupled to a node, wherein current flows from the voltage supply through the resistor and the transistor into the node;
    a second resistor coupled to ground;
    a second transistor device having an emitter coupled to the second resistor, a base, and a collector coupled to the node, wherein current flows from the node through the second transistor and the second resistor to ground;
    a third transistor device having an emitter coupled to the base of the first transistor, a base, and a collector coupled to the emitter of the second transistor device, wherein leakage current flowing from the node through the first transistor device is directed back to the node through the third transistor device and the second transistor device.

17. The computer system of claim 16, wherein the leakage current flowing from the node is Rcb leakage current associated with the first transistor device.

18. The computer system of claim 17 further comprising an operational amplifier circuit having a first input for accepting a bias voltage, a second input coupled to the emitter of the first transistor and an output coupled to the base of the third transistor device, wherein said operational amplifier circuit maintains a constant current flowing through the first transistor device.

* * * * *